(12) United States Patent
Schmitt et al.

(10) Patent No.: US 9,304,872 B2
(45) Date of Patent: Apr. 5, 2016

(54) METHOD FOR PROVIDING A VALUE FOR DETERMINING WHETHER AN ERROR HAS OCCURRED IN THE EXECUTION OF A PROGRAM

(76) Inventors: Andre Schmitt, Chemnitz (DE); Ute Schiffel, Dresden (DE); Christof Fetzer, Dresden (DE); Martin Suesskraut, Dresden (DE)

( * ) Notice: Subject to any disclaimer, the term of this patent is extended or adjusted under 35 U.S.C. 154(b) by 291 days.

(21) Appl. No.: 13/821,837

(22) PCT Filed: Sep. 9, 2011

(86) PCT No.: PCT/EP2011/065606
§ 371 (c)(1),
(2), (4) Date: Jun. 20, 2013

(87) PCT Pub. No.: WO2012/032140
PCT Pub. Date: Mar. 15, 2012

(65) Prior Publication Data
US 2013/0262938 A1    Oct. 3, 2013

(30) Foreign Application Priority Data
Sep. 10, 2010  (DE) .......................... 10 2010 037 457

(51) Int. Cl.
*G06F 11/00*   (2006.01)
*G06F 11/14*   (2006.01)
(Continued)

(52) U.S. Cl.
CPC .......... *G06F 11/1479* (2013.01); *G06F 11/085* (2013.01); *G06F 11/28* (2013.01); *H03M 13/47* (2013.01); *H03M 13/49* (2013.01); *H03M 13/51* (2013.01)

(58) Field of Classification Search
CPC . G06F 11/076; G06F 11/085; G06F 11/1479; G06F 11/28; G06F 11/3636; H03M 13/47; H03M 13/49; H03M 13/51
See application file for complete search history.

(56) References Cited

U.S. PATENT DOCUMENTS 5,974,529 A * 10/1999 Zumkehr et al. ................ 712/41
6,678,837 B1 * 1/2004 Quach et al. ................ 714/38.13
(Continued)

FOREIGN PATENT DOCUMENTS

| DE | 102 19 501 A1 | 11/2003 |
|----|---|---|
| DE | 10 2007 040 721 A1 | 6/2008 |
| DE | 10 2009 037 630 A1 | 2/2011 |

OTHER PUBLICATIONS

International Search Report/Written Opinion for Application No. PCT/EP2011/065606 dated Dec. 7, 2011.
(Continued)

*Primary Examiner* — Marc Duncan
(74) *Attorney, Agent, or Firm* — Alston & Bird LLP

(57) ABSTRACT

In one embodiment, a method is provided for data processing in order to provide a value for determining whether an error has occurred in the execution of a program. The method may include: determining a numerical value on the basis of a plurality of reference numbers determined by a checking circuit outside the program; determining a signature of at least one instruction of the program by means of an arithmetic code; updating a cumulative value on the basis of the numerical value and the signature; and transferring the updated cumulative value to the checking circuit in order to determine whether an error has occurred in the execution of the program, on the basis of the plurality of reference numbers and the cumulative value.

15 Claims, 7 Drawing Sheets

(51) Int. Cl.
*G06F 11/08* (2006.01)
*G06F 11/28* (2006.01)
*H03M 13/47* (2006.01)
*H03M 13/49* (2006.01)
*H03M 13/51* (2006.01)

(56) References Cited

U.S. PATENT DOCUMENTS

| | | | | |
|---|---|---|---|---|
| 7,506,217 B2* | 3/2009 | Borin et al. | | 714/51 |
| 2003/0221121 A1* | 11/2003 | Chow et al. | | 713/200 |
| 2011/0041013 A1 | 2/2011 | Ingimundarson | | |
| 2013/0007420 A1* | 1/2013 | Van Assche et al. | | 712/220 |
| 2013/0212441 A1* | 8/2013 | Vilela et al. | | 714/49 |
| 2013/0219231 A1* | 8/2013 | Richter et al. | | 714/48 |
| 2014/0325239 A1* | 10/2014 | Ghose | | 713/190 |

OTHER PUBLICATIONS

International Preliminary Report on Patentability for Application No. PCT/EP2011/065606 dated Mar. 21, 2013.

Fei, Y. et al., *Microarchictectural Support for Program Code Integirty Monitoring in Application—specification Instruction set Processors*, Design, Automation and Test in Europe Conference and Exhibition 07 (Apr. 16-20, 2007) 6 pages.

Fetzer, C. et al., *AN—Encoding Compiler: Building Safety-Critical Systems With Commodity Hardware*, Computer Safety, Reliability, and Security, Lecture Notes in Computer Science, vol. 5775/2009 (2009) 238-296.

Mahmood, A. et al., *Concurrent Error Detection Using Watchdog Processors—A Survey*, IEEE Transactions on Computers, vol. 37, No. 2 (Feb. 1, 1998) 160-174.

Susskraut, M. et al., *White paper: Encoding Compiler and Encoded Processing*, XP55013279, Computer Science Department, Dresden, Germany (Feb. 27, 2011) 12 pages.

Wappler, U. et al. *Software Encoded Processing: Building Dependable Systems With Commodity Hardware*, Computer Safety, Reliability, and Security [Lecture Notes in Computer Science] (Sep. 18, 2007) 356-369.

\* cited by examiner

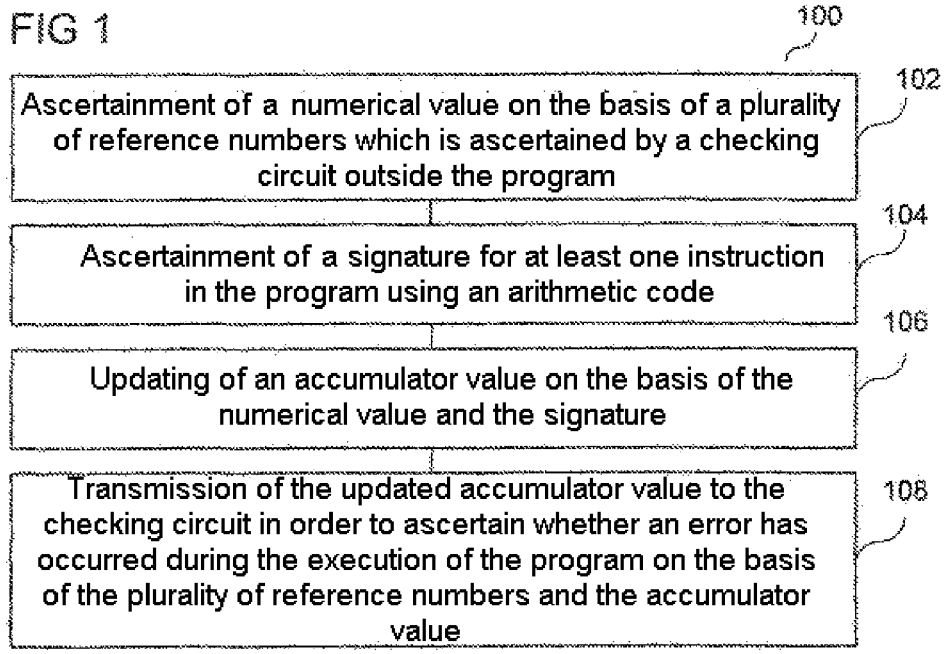
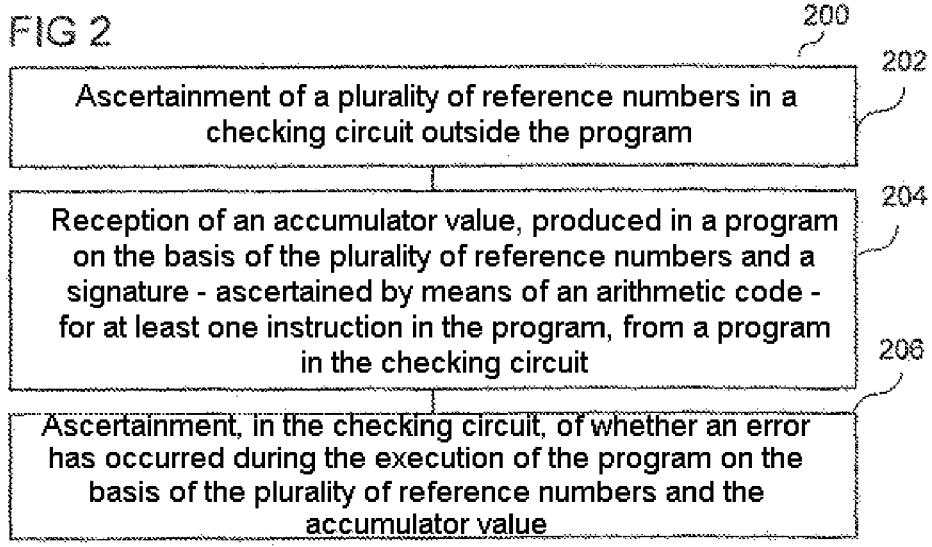

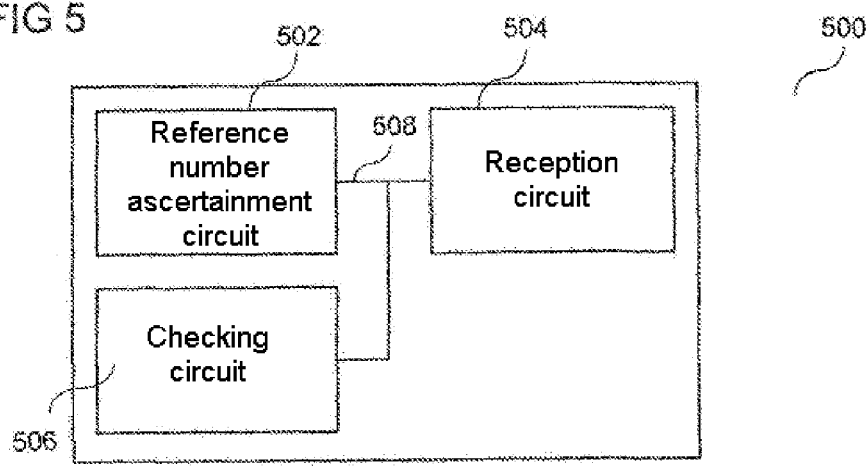
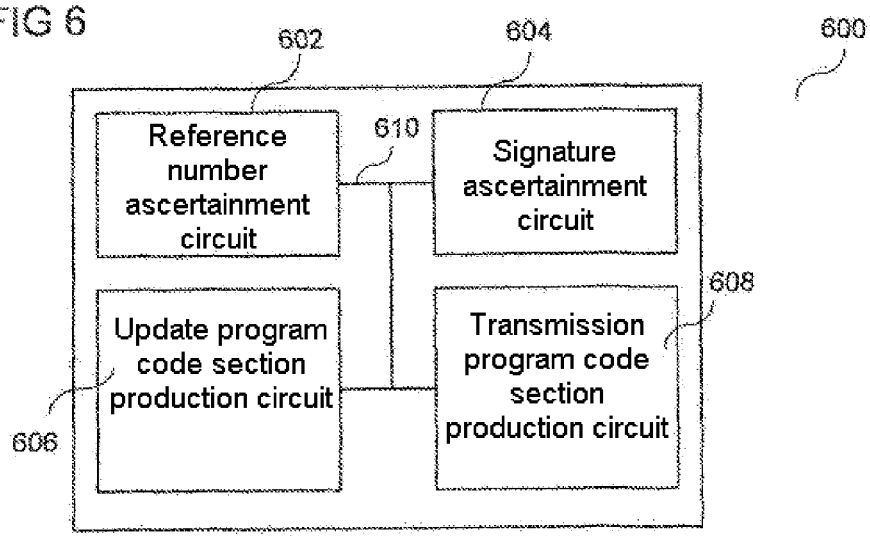

METHOD FOR PROVIDING A VALUE FOR DETERMINING WHETHER AN ERROR HAS OCCURRED IN THE EXECUTION OF A PROGRAM

CROSS REFERENCE TO RELATED APPLICATIONS

This application is a national stage application filed under 35 U.S.C. 371 of International Application No. PCT/KR2011/065606, filed Sep. 9, 2011, which claims priority from German Patent Application No. 10 2010 037 457.1, filed Sep. 10, 2010, each of which is incorporated by reference herein in its entirety.

The invention relates to methods for data processing for providing a value for determining whether an error has occurred during execution of a program, methods for data processing for determining whether an error has occurred during execution of a program, methods for producing program code, data processing arrangements for providing a value for determining whether an error has occurred during execution of a program, data processing arrangements for determining whether an error has occurred during execution of a program, and data processing arrangements for producing program code.

It is to be expected that standard hardware or mass hardware ("commodity hardware") becomes ever less reliable on account of the continuously rising integration density and shrinking feature sizes of new generations of integrated circuits. On the basis of economic factors, attempts are being made to use ever more standard hardware with unsatisfactory error recognition in critical applications. This gives rise to the need to recognize hardware errors in software. One possible solution for detecting hardware errors in software is to use AN codes, as will be described in more detail below. AN codes can be used to generate coded programs. These codes detect hardware errors irrespective of the actual error mode of the underlying hardware. However, measurements have shown that programs coded using AN codes still contain high rates of undetected silent data errors ("silent data corruption", SDC). These high rates of undetected SDCs are caused by inadequate protection of the control flow (or execution flow) and data flow by AN codes. By contrast, ANB and ANBD codes, as will be explained in more detail below, promise much higher error recognition rates because they also detect errors in the control and data flows.

DE 102 19 501 B4 discloses a CPU which executes an original program and a coded program in succession as a combination of diversity and coding, and in which a checking unit (watchdog) compares the outputs from both programs. This provides no support for dynamic memory, however, because the method described (particularly the coding described) is oriented to very specific programming languages (KOP (contact plan)/FUP (function plan)) from automation engineering. The combination of diversity and simplified coding does not protect against permanent errors. The coding is simpler than ANB and ANBD and also covers fewer error patterns, however. The coding alone cannot recognize the following errors: control flow errors (jump to incorrect destination); operand errors (that is to say transposed operands: instead of x+y, x+z is calculated, where z is not equal to y); lost stores (a value is not stored at address p, as prescribed, but rather is stored at address q, which is not equal to p). These three classes of error can be recognized only in combination with the diversity. However, the diversity described provides only inadequate protection against permanent errors. Permanent errors will occur more frequently in future, however, because hardware ages more quickly, owing to shrinking feature sizes.

Fei Y. et al., "Microarchitectural Support for Program Code Integrity Monitoring in Application-specific Instruction Set Processors", Design, Automation and Test in Europe Conference and Exhibition 07, Apr. 16-20, 2007, discloses error monitoring by virtue of comparison of expected and actual program execution on the basis of hash functions.

DE 10 2007 040 721 A1 discloses a checking device which is configured to use the signature information associated with a memory element in order to check whether a data word stored in the memory element is a valid code word.

DE 10 2009 037 630 A1 proposes continuously determining an error detection code from a continuous code sequence which relates to an actually executed section of a program code, and comparing a current error detection code with a predetermined error code in order to check the correct execution of the program code and to indicate an error.

The invention is based on the problem of providing data processing arrangements and methods for reliably recognizing errors in program execution.

The problem is solved by methods and data processing arrangements having the features according to the independent patent claims.

Developments arise from the dependent claims.

Exemplary embodiments of the invention are shown in the figures and are explained in more detail below.

FIG. 1 shows a flowchart which illustrates a method for data processing for providing a value for determining whether an error has occurred during execution of a program, based on an exemplary embodiment of the invention.

FIG. 2 shows a flowchart which illustrates a method for data processing for determining whether an error has occurred during execution of a program, based on an exemplary embodiment of the invention.

FIG. 5 shows a data processing arrangement for determining whether an error has occurred in program execution, based on an exemplary embodiment of the invention.

FIG. 6 shows a data processing arrangement for producing program code for providing a value for determining whether an error has occurred in program execution, based on an exemplary embodiment of the invention.

Figure 3:
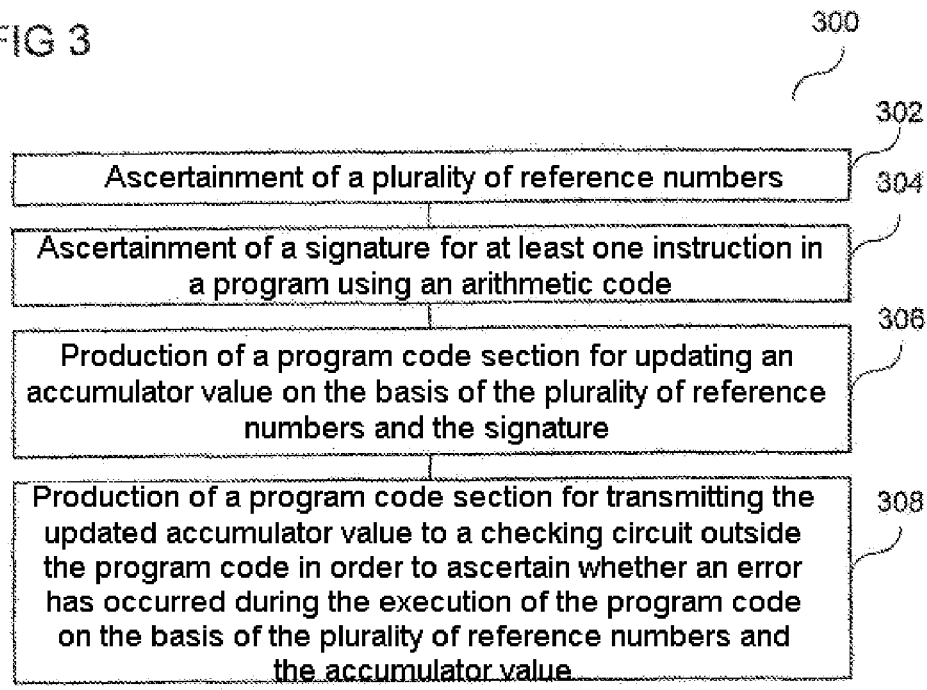
FIG. 3 shows a flowchart which illustrates a method for producing program code for providing a value for determining whether an error has occurred during execution of a program, based on an exemplary embodiment of the invention.

FIG. 1 shows a flowchart 100 which illustrates a method for data processing for providing a value for determining whether an error has occurred during execution of a program (in other words: during (or: in) program execution), based on an exemplary embodiment of the invention. In 102, a numerical value can be determined on the basis of a plurality of reference numbers which is determined by a checking circuit outside the program. In 104, a signature for at least one instruction in the program can be determined using an arithmetic code. In 106, an accumulator value can be updated on the basis of the numerical value and the signature. In 108, the updated accumulator value can be transmitted to the checking circuit in order to determine whether an error has occurred during the execution of the program on the basis of the plurality of reference numbers and the accumulator value.

In one embodiment, the arithmetic code may be an arithmetic code having signatures. In one embodiment, the arithmetic code may be any desired arithmetic code which can be or is extended by signatures.

In one embodiment, the arithmetic code may contain at least one of the following codes or may be at least one of the following codes: an AN code, as is explained further below; an ANB code, as is explained further below; an ANBD code, as is explained further below; an ANBDmem code, as is explained further below; a residue code, which is known to a person skilled in the art as such; and a Berger code, which is known to a person skilled in the art as such.

In one embodiment, the plurality of reference numbers may be a plurality of prescribed random numbers.

In one embodiment, the plurality of reference numbers may be an orderly list of prescribed random numbers.

In one embodiment, the numerical value may be a difference between two reference numbers.

In one embodiment, the numerical value may be a difference between two successive reference numbers.

In one embodiment, the accumulator value can be updated on the basis of subtraction of a signature for a basic block of the program, and respective addition of the signature of the succeeding basic block.

A basic block is a sequence of program instructions (in other words: instructions) having precisely one entry point (at the start of the sequence) and precisely one exit point at the end of the sequence. The exit point is a conditional or unconditional jump or a return to the called function. Function calls can be represented by exit points or a simple program instruction within the sequence.

In one embodiment, the accumulator value can be updated on the basis of addition of the numerical value.

In one embodiment, an identifier for a basic block of the program can be determined.

In one embodiment, the accumulator value can be updated also on the basis of the identifier of the block.

In one embodiment, the updated accumulator value can be transmitted after a or each function of the program, after a or each program instruction in the original program, after a or each basic block and/or together with the outputs from the program, which are or is intended to prompt determination of whether an error (in other words: an execution error) has occurred.

In one embodiment, the accumulator value can be transmitted at least twice (for example before and after an update, or after a first update and after a second update), and it is possible to determine whether an error (in other words: an execution error) has occurred between the first transmission and the second transmission.

In one embodiment, it is possible to determine whether an error (in other words: an execution error) has occurred on the basis of a check to determine whether the transmitted accumulator value corresponds to the difference between two reference numbers.

In one embodiment, the checking circuit may be implemented using safe hardware.

In one embodiment, the checking circuit may be protected by redundancy.

In one embodiment, the checking circuit may be protected by arithmetic codes.

FIG. 2 shows a flowchart 200 which illustrates a method for data processing for determine whether an error has occurred in execution of a program (in other words: during (or: in) program execution), based on an exemplary embodiment of the invention. In 202, a plurality of reference numbers can be determined in a checking circuit outside the program. In 204, an accumulator value generated in a program on the basis of the plurality of reference numbers and a signature—determined by means of an arithmetic code—for at least one instruction in the program can be received from a program in the checking circuit. In 206, it is possible to determine, in the checking circuit, whether an error has occurred during the execution of the program on the basis of the plurality of reference numbers and the accumulator value.

In one embodiment, the arithmetic code may be an arithmetic code having signatures. In one embodiment, the arithmetic code may be any desired arithmetic code which can be or is extended by signatures.

In one embodiment, the arithmetic code may contain at least one of the following codes or may be at least one of the following codes: an AN code, as is explained further below; an ANB code, as is explained further below; an ANBD code, as is explained further below; an ANBDmem code, as is explained further below; a residue code, which is known to a person skilled in the art as such; and a Berger code, which is known to a person skilled in the art as such.

In one embodiment, the plurality of reference numbers may be a plurality of prescribed random numbers.

In one embodiment, the plurality of reference numbers may be an orderly list of prescribed random numbers.

In one embodiment, an identifier for a basic block of the program can be determined.

In one embodiment, the updated accumulator value can be received after a or each function of the program, after a or each program instruction in the original program, after a or each basic block and/or together with the outputs from the program, which are or is intended to prompt determination of whether an error (in other words: an execution error) has occurred.

In one embodiment, the accumulator value can be received at least twice (for example before and after an update, or after a first update and after a second update), and it is possible to determine whether an error (in other words: an execution error) has occurred between the first reception and the second reception.

In one embodiment, it is possible to determine whether an error (in other words: an execution error) has occurred on the basis of a check to determine whether the received accumulator value corresponds to the difference between two reference numbers.

In one embodiment, the checking circuit may be implemented using safe hardware.

In one embodiment, the checking circuit may be protected by redundancy.

In one embodiment, the checking circuit may be protected by arithmetic codes.

FIG. 3 shows a flowchart 300 which illustrates a method for producing program code for providing a value for determining whether an error has occurred during execution of a program (in other words: during (or: in) program execution), based on an exemplary embodiment of the invention. In 302, a plurality of reference numbers can be determined. In 304, a signature for at least one instruction in a program can be determined using an arithmetic code. In 306, a program code section for updating an accumulator value on the basis of the plurality of reference numbers and the signature can be generated. In 308, a program code section for transmitting the updated accumulator value to a checking circuit outside the program code in order to determine whether an error has occurred during the execution of the program code on the basis of the plurality of reference numbers and the accumulator value may be generated.

In one embodiment, the arithmetic code may be an arithmetic code having signatures. In one embodiment, the arithmetic code may be any desired arithmetic code which may be or is extended by signatures.

In one embodiment, the arithmetic code may contain at least one of the following codes or may be at least one of the following codes: an AN code, as is explained further below; an ANB code, as is explained further below; an ANBD code, as is explained further below; an ANBDmem code, as is explained further below; a residue code, which is known to a person skilled in the art as such; and a Berger code, which is known to a person skilled in the art as such.

In one embodiment, the plurality of reference numbers may be a plurality of prescribed random numbers.

In one embodiment, the plurality of reference numbers may be an orderly list of prescribed random numbers.

In one embodiment, the numerical value may be a difference between two reference numbers.

In one embodiment, the numerical value may be a difference between two successive reference numbers.

In one embodiment, the accumulator value can be updated on the basis of subtraction of signature for a basic block of the program, and respective addition of the signature of each function in the block.

In one embodiment, the accumulator value can be updated on the basis of addition of the numerical value.

In one embodiment, an identifier for a basic block of the program can be determined.

In one embodiment, a program code section for updating the accumulator value also on the basis of the identifier of the block can be generated.

In one embodiment, a program code section for transmitting the accumulator value after a or each function of the program, after a or each program instruction in the original program, after a or each basic block and/or together with the outputs from the program, which are or is intended to prompt determination of whether an error (in other words: an execution error) has occurred, can be generated.

In one embodiment, the checking circuit may be implemented using safe hardware.

In one embodiment, the checking circuit may be protected by redundancy.

In one embodiment, the checking circuit may be protected by arithmetic codes.

Figure 4:
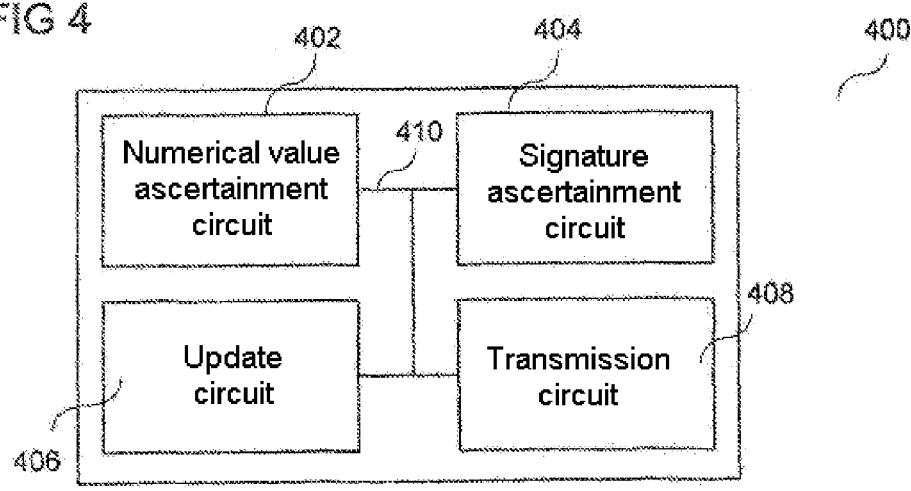
FIG. 4 shows a data processing arrangement for providing a value for determining whether an error has occurred during execution of a program, based on an exemplary embodiment of the invention.

FIG. 4 shows a data processing arrangement 400 for providing a value for determining whether an error has occurred during execution of a program (in other words: during (or: in) program execution), based on an exemplary embodiment of the invention. The data processing arrangement 400 may contain a numerical value determination circuit 402 which is configured to determine a numerical value on the basis of a plurality of reference numbers which is determined by a checking circuit (not shown) outside the program; a signature determination circuit 404 which is configured to determine a signature for at least one instruction in the program using an arithmetic code; an update circuit 406 which is configured to update an accumulator value on the basis of the numerical value and the signature; and a transmission circuit 408 which is configured to transmit the updated accumulator value to the checking circuit in order to determine whether an error has occurred during the execution of the program on the basis of the plurality of reference numbers and the accumulator value. The numerical value determination circuit 402, the signature determination circuit 404, the update circuit 406 and the transmission circuit 408 can communicate with one another and interchange information via a connection 410, for example a wire, a plurality of separate wires, a bus, or by means of wireless link.

As a good example, the data processing arrangement 400 may be an arrangement for executing a program which is intended to be monitored for errors.

In one embodiment, the arithmetic code may be an arithmetic code having signatures. In one embodiment, the arithmetic code may be any desired arithmetic code which can be or is extended by signatures.

In one embodiment, the arithmetic code may contain at least one of the following codes or may be at least one of the following codes: an AN code, as is explained further below; an ANB code, as is explained further below; an ANBD code, as is explained further below; an ANBDmem code, as is explained further below; a residue code, which is known to a person skilled in the art as such; and a Berger code, which is known to a person skilled in the art as such.

In one embodiment, the plurality of reference numbers may be a plurality of prescribed random numbers.

In one embodiment, the plurality of reference numbers may be an orderly list of prescribed random numbers.

In one embodiment, the numerical value may be a difference between two reference numbers.

In one embodiment, the numerical value may be a difference between two successive reference numbers.

In one embodiment, the update circuit 406 may be configured to update the accumulator value on the basis of subtraction of a signature for a basic block of the program, and respective addition of the signature of the succeeding basic block.

In one embodiment, the update circuit 406 may be configured to update the accumulator value on the basis of addition of the numerical value.

In one embodiment, the data processing arrangement 400 may also contain a block signature determination circuit (not shown) which is configured to determine an identifier for a basic block of the program.

In one embodiment, the update circuit 406 may be configured to update the accumulator value also on the basis of the identifier of the block.

In one embodiment, the transmission circuit 408 may be configured to transmit the updated accumulator value after a or each function of the program, after a or each program instruction in the original program, after a or each basic block and/or together with the outputs from the program, which are or is intended to prompt determination of whether an error (in other words: an execution error) has occurred.

In one embodiment, the transmission circuit 408 may be configured to transmit the accumulator value at least twice (for example before and after an update, or after a first update and after a second update), and the checking circuit may be configured to check whether an error (in other words: an execution error) has occurred between the first transmission and the second transmission.

In one embodiment, the checking circuit may be configured to determine whether an error has occurred on the basis of a check to determine whether the transmitted accumulator value corresponds to the difference between two reference numbers.

In one embodiment, the checking circuit may be implemented using safe hardware.

In one embodiment, the checking circuit may be protected by redundancy.

In one embodiment, the checking circuit may be protected by arithmetic codes.

FIG. 5 shows a data processing arrangement 500 for determining whether an error has occurred during execution of a program (in other words: during (or: in) program execution), based on an exemplary embodiment of the invention. The data processing arrangement 500 may include: a reference number determination circuit 502 which is configured to determine a plurality of reference numbers in a checking circuit 506 outside the program; a reception circuit 504 which is configured to receive an accumulator value, generated in a program on the basis of the plurality of reference numbers and a signature—determined by means of an arithmetic code—for at least one instruction in the program, from a program in the checking circuit; and a checking circuit 506 which is configured to determine whether an error has occurred during the execution of the program on the basis of the plurality of reference numbers and the accumulator value. The reference number determination circuit 502, the reception circuit 504 and the checking circuit 506 can communicate with one another and interchange information via a connection 508, for example a wire, a plurality of separate wires, a bus, or by means of a wireless link.

As a good example, the data processing arrangement 500 may be an arrangement for checking whether an error (in other words: an execution error) has occurred in another data processing device.

In one embodiment, the arithmetic code may be an arithmetic code having signatures. In one embodiment, the arithmetic code may be any desired arithmetic code which can be or is extended by signatures.

In one embodiment, the arithmetic code may include at least one of the following codes or may be at least one of the following codes: an AN code, as is explained further below; an ANB code, as is explained further below; an ANBD code, as is explained further below; an ANBDmem code, as is explained further below; a residue code, which is known to a person skilled in the art as such; and a Berger code, which is known to a person skilled in the art as such.

In one embodiment, the plurality of reference numbers may be a plurality of prescribed random numbers.

In one embodiment, the plurality of reference numbers may be an orderly list of prescribed random numbers.

In one embodiment, the data processing arrangement 500 may also contain a circuit (not shown) which is configured to determine an identifier for a basic block of the program.

In one embodiment, the reception circuit 504 may be configured to receive the updated accumulator value after an instruction in the program which is intended to prompt determination of whether an error (in other words: an execution error) has occurred.

In one embodiment, the reception circuit 504 may be configured to receive the accumulator value at least twice (for example before and after an update, or after a first update and after a second update), and the checking circuit 506 may be configured to determine whether an error (in other words: an execution error) has occurred between the first reception and the second reception.

In one embodiment, the checking circuit 506 may be configured to determine whether an error (in other words: an execution error) has occurred on the basis of a check to determine whether the received accumulator value corresponds to the difference between two reference numbers.

In one embodiment, the checking circuit 506 may be implemented using safe hardware.

In one embodiment, the checking circuit 506 may be protected by redundancy.

In one embodiment, the checking circuit 506 may be protected by arithmetic codes.

FIG. 6 shows a data processing arrangement 600 for producing program code for providing a value for determining whether an error has occurred during execution of a program (in other words: during (or: in) program execution), based on an exemplary embodiment of the invention. The data processing arrangement 600 may contain: a reference number determination circuit 602 which is configured to determine a plurality of reference numbers; a signature determination circuit 604 which is configured to determine a signature for at least one instruction in a program using an arithmetic code; an update program code section production circuit 606 which is configured to generate a program code section for updating an accumulator value on the basis of the plurality of reference numbers and the signature; and a transmission program code section production circuit 608 which is configured to generate a program code section for transmitting the updated accumulator value to a checking circuit outside the program code in order to determine whether an error has occurred during execution of the program code on the basis of the plurality of reference numbers and the accumulator value. The reference number determination circuit 602, the signature determination circuit 604, the update program code section production circuit 606 and the transmission program code section production circuit 608 can communicate with one another and interchange information via a connection 610, for example a wire, a plurality of separate wires, a bus, or by means of a wireless link.

As a good example, the data processing arrangement 600 may be a compiler for producing a program code which can be executed by data processing in order to execute a program.

In one embodiment, the arithmetic code may be an arithmetic code having signatures. In one embodiment, the arithmetic code may be any desired arithmetic code which can be or is extended by signatures.

In one embodiment, the arithmetic code may contain at least one of the following codes or may be at least one of the following codes: an AN code, as is explained further below; an ANB code, as is explained further below; an ANBD code, as is explained further below; an ANBDmem code, as is explained further below; a residue code, which is known to a person skilled in the art as such; and a Berger code, which is known to a person skilled in the art as such.

In one embodiment, the plurality of reference numbers may be a plurality of prescribed random numbers.

In one embodiment, the plurality of reference numbers may be an orderly list of prescribed random numbers.

In one embodiment, the numerical value may be a difference between two reference numbers.

In one embodiment, the numerical value may be a difference between two successive reference numbers.

In one embodiment, the update program code section production circuit 606 may be configured to generate a program code section for updating the accumulator value on the basis of subtraction of a signature for a basic block in the program, and respective addition of the signature of the succeeding basic block.

In one embodiment, the update program code section production circuit 606 may be configured to generate a program code section for updating the accumulator value on the basis of addition of the numerical value.

In one embodiment, the data processing arrangement 600 may also contain a circuit (not shown) which is configured to determine an identifier for a basic block of the program.

In one embodiment, the update program code section production circuit 606 may be configured to generate a program code section for updating the accumulator value also on the basis of the identifier of the block.

In one embodiment, the transmission program code section production circuit 608 may be configured to generate a program code section for transmitting the accumulator value after a or each function of the program, after a or each program instruction in the original program, after a or each basic block and/or together with the outputs from the program, which are or is intended to prompt determination of whether an error (in other words: an execution error) has occurred.

In one embodiment, the checking circuit may be implemented using safe hardware.

In an embodiment, the checking circuit may be protected by redundancy.

In an embodiment, the checking circuit may be protected by arithmetic codes.

In an embodiment, a method for communication between two programs coded by means of arithmetic codes can be provided, wherein the two programs interchange values which are coded by means of the same arithmetic codes.

In an embodiment, a data processing apparatus can be provided, configured for communication between two programs coded by means of arithmetic codes, wherein the two programs interchange values which are coded by means of the same arithmetic codes.

In an embodiment, data processing arrangements and methods can be provided for automatically monitoring program execution of programs which are protected by arithmetic codes using signatures for the early recognition of erroneous deviations in the control and data flows of the program.

In an embodiment, data processing arrangements and methods can be provided for checking the control flow and detecting the execution of illegal sequences of instructions during the program execution.

In an embodiment, data processing arrangements and methods can be provided for arithmetic codes, functional safety, software error detection and control flow checking.

Further techniques are described below. Algorithm-based error tolerance and software which controls itself can use invariants in order to check the validity of the generated results. If corresponding invariants are present, a way of recognizing faults may result.

Software approaches to recognizing hardware errors may be replicated execution and comparison (voting) of the attained results. The software to be protected can be altered during or before compilation. It is possible to apply dynamic instrumentation at runtime. The replication can be applied at various levels. Individual instructions can be duplicated within a processing thread. Others can execute duplicates of the whole program with a plurality of threads.

Error recognition in hardware can be attained through duplicate, triplicate or further orders of redundant execution. In addition, built-in self tests can be implemented directly in hardware.

Programs can be protected using arithmetic codes having signatures by means of VCP and SEP.

When solely checking the control flow, it is not possible to recognize any errors which relate only to the data flow of a program. The control flow can be checked only between basic blocks in a program, and control flow errors within a block cannot be recognized.

In an embodiment, support for programs can be provided using arbitrarily dynamically interleaved control structures, dynamically allocated and accessed memories, and outputs can be permitted at arbitrary points in the program execution, and the implementation of "fail fast" behavior in programs can be made possible, that is to say that errors can be recognized as quickly as possible, which can permit an early reaction.

In an embodiment, data processing arrangements and methods can be provided for using signatures generated at the runtime of the program by coded execution. The signatures generated may be inextricably dependent on the control and data flows of the execution of the program, which execution is protected by the arithmetic code using signatures. If an execution error occurs, the coded application cannot send the value expected by the watchdog (checking circuit) for checking purposes.

In an embodiment, the frequency of the values sent to the watchdog for checking purposes can be adjusted from "after each instruction" to "before output", which means that errors can be recognized before an erroneous output becomes visible externally.

In an embodiment, the values which the watchdog checks can be generated statically during the transformation process and may be randomly selectable values of arbitrary size and number which are totally independent of the program, which means that it is possible to preclude random production of these values despite transient or permanent errors during execution of the program with arbitrary probability.

In an embodiment, the source code to be protected for the program can be transformed, prior to the actual execution, into a semantically identical but protected version, the correct execution of which can then be checked by a safe watchdog process at runtime. For this, the software encoding compiler can automatically transform the execution description of the program into a version that is protected by an arithmetic code using signatures, and can then generate a coded program which can be executed on the destination platform.

In an embodiment, the transformation process can ensure that after it has concluded, the watchdog process can recognize when the later execution of the program deviates from the execution description stipulated by the programmer.

In an embodiment, completely automated protection of dynamic and interleaved execution descriptions and of the control and data flows of arbitrary programs can be provided for the purpose of recognition of errors during the execution.

In an embodiment, combined protection of the data flow in an inextricable link to the recognition of erroneous instruction execution can be provided.

In an embodiment, accumulated signatures can be generated for arithmetically encoded programs, which can allow the protection to be flexibly matched to the required safety and can require little additional memory overhead and CPU overhead.

In an embodiment, automatic protection of the execution description of programs protected using arithmetic codes having signatures can be provided.

In an embodiment, only few additional CPU cycles and little additional program memory are required.

In an embodiment, the protected program generated by the software encoding compiler can be executed directly on unsafe hardware.

In an embodiment, the scope of the protection can be determined by the user flexibly.

In an embodiment, support for programs can be provided using arbitrarily dynamically interleaved control structures and dynamically allocated memory, and outputs can be permitted at arbitrary points in the program execution.

In an embodiment, the implementation of "fail fast" behavior in programs can be made possible, that is to say that errors can be recognized as quickly as possible, which can permit an early reaction.

In an embodiment, the execution of the program, including the control and data flows, can be protected flexibly with a particular mathematically verifiable probability.

In an embodiment, a plurality of protected and unprotected programs can run in parallel on a computer.

Embodiments can be used in safety-relevant applications, for example in automotive engineering, aircraft engineering or medical engineering.

Figure 7:
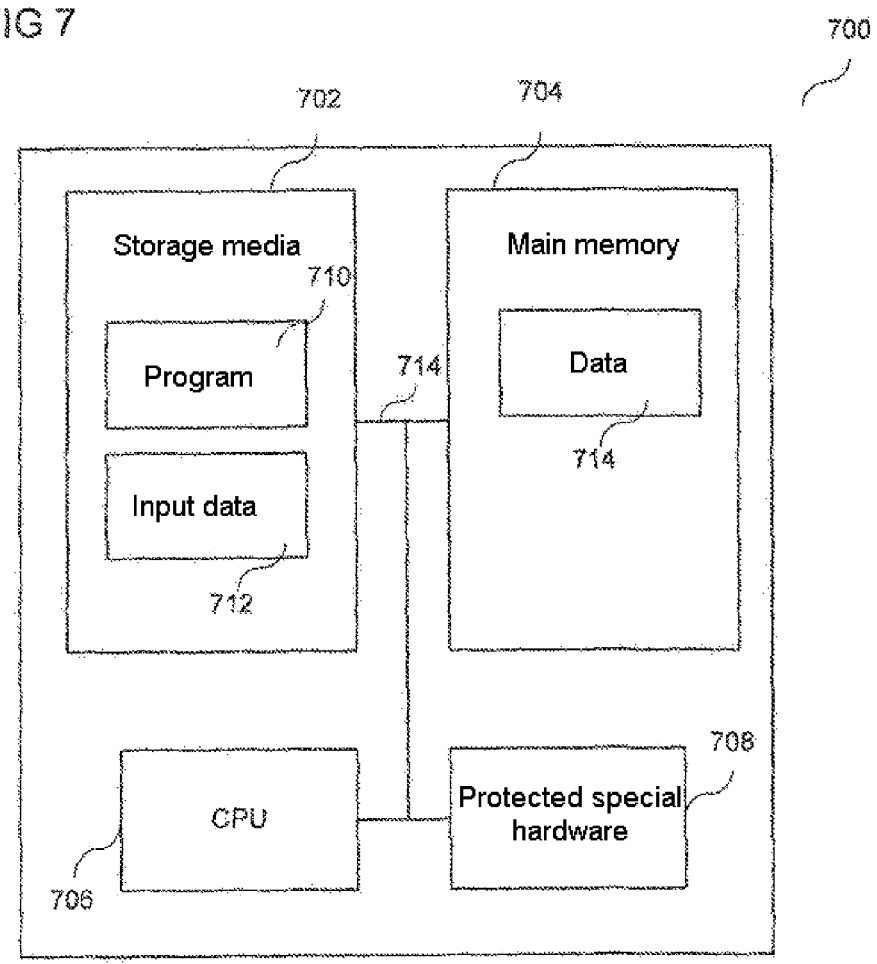
FIG. 7 shows a data processing arrangement based on an exemplary embodiment of the invention.

FIG. 7 shows a data processing arrangement 700 based on an exemplary embodiment of the invention. The data processing arrangement 700 can be used as one or more of the data processing arrangements cited above (for example as described in FIGS. 4 to 6). The data processing arrangement 700 may include storage media 702 which may include a program 710 or a plurality of programs and also input data 712. The program 710 may be a program which can execute one of the methods cited above, for example compilation, program execution which is intended to be monitored for errors or program execution which monitors errors during execution of another program. In the case of compilation, the input data 712 may then contain the source code of the program to be compiled. In addition, the data processing arrangement 700 may contain a main memory 704 which may contain data 714. The data 714 may contain data from a currently executed program. In addition, the data processing arrangement 700 may contain a central processing unit 706 (CPU) which controls and executes the processing. In addition, the data processing arrangement 700 may contain protected special hardware 708. By way of example, the checking circuit 506 described above can be provided in the protected special hardware 708, which operates in assuredly error-free fashion. The components of the data processing arrangement 700 that are described can communicate with one another and interchange information using a connection 714, for example a wire, a plurality of separate wires, a bus, or by means of a wireless link.

In an embodiment, an encoding compiler is provided which automatically applies AN, ANB and/or ANBD code to an application. Error injections show that AN, ANB and ANBD codes can successfully detect errors and that ANB and ANBD codes can reduce the SDC rate more effectively than AN codes. The difference between ANBD and ANB codes may also be visible, but may be less pronounced.

In an embodiment, data processing arrangements and methods for ANB, ANBDmem, residue and/or Berger encoding and for determining hardware errors are provided in software.

In the future, the increase in the integration density or the shrinking of feature sizes for integrated circuits will result in less reliable hardware. Currently used hardware-based solutions for determining hardware errors can be expensive and an order of magnitude slower than standard hardware. Therefore, for reasons of cost pressure, ever more critical systems are being constructed on or using unreliable standard hardware. However, standard hardware exhibits not only fail stop behavior but also silent data corruptions (SDC) which are difficult to detect and mask, i.e. it generates an erroneous output instead of crashing. In order to use this unreliable hardware in critical systems, it is necessary to extend its restricted error detection capabilities using software.

On the basis of embodiments, the option of monitoring the program execution of programs protected using arithmetic codes having signatures is provided in order to recognize when the execution of the program deviates from the execution description stipulated by the programmer. On the basis of embodiments, deviations in the data flow and in the control flow of the program can be recognized early during the execution of the program with a particular probability.

As a result of these errors being recognized, it is possible for otherwise randomly failing systems to be transferred to a safe state (failsafe) and for appropriate error handling measures to be initiated, e.g. an attempt at fresh execution. On the basis of embodiments, new designs for optimistic program execution (retry and error) and safety measures are provided.

Currently used hardware-based solutions for recognizing errors can be expensive, can require special hardware and may be orders of magnitude slower than the current hardware generation allows.

On the basis of exemplary embodiments, a system which converts SDCs into stop errors which are much easier to handle is provided which does not require special hardware.

When the detection or recognition of hardware errors is implemented in software, more CPU cycles are required for executing an application or a program. However, instead of special reliable hardware, it is possible to use standard hardware. By way of example, standard hardware may be cheaper than special reliable hardware, and also faster, because it uses the latest hardware components. In addition, in some systems only a small number of application components may be critical and only these components may be required to be protected by additional error recognition. Therefore, the effect of the performance difference may relate only to critical application components.

On the basis of embodiments, an error recognition approach can be provided on the basis of arithmetic codes which supports end-to-end software-implemented hardware error recognition, i.e. is able to protect data against undetected errors during storage, transport and calculations. Its error recognition capabilities may be decoupled from the hardware used.

In order to use arithmetic codes, it may be advantageous to have programs which can operate with arithmetically encoded data. On the basis of embodiments, an encoding compiler is provided which supports various arithmetic codes, as are described further below and are known to a person skilled in the art as such: AN code, ANB code, ANBD code, ANBDmem code, residue code and Berger code. These codes can provide various error recognition rates at various runtime costs. Therefore, the error recognition rate can be weighed up against the runtime costs.

On the basis of exemplary embodiments, ANB, ANBD, AMBDmem, residue and/or Berger codes can be used to provide the recognition of data and control flow errors. On the basis of exemplary embodiments, any control and data flow which is not predictable at the time of encoding (in other words at the time of compilation) is supported.

On the basis of exemplary embodiments, the number of SDCs for ANB-encoded programs and ANBDmem-encoded programs can be reduced by 99.2% or 99.7% in comparison with uncoded programs. AN encoding can result in a reduction by 93.5%.

On the basis of exemplary embodiments, arithmetic codes may be a technique for recognizing hardware errors at runtime. This encoding can add redundancy to all data words. Valid code words may be only a small subset of all possible data words. In this case, the set of all possible data words may be the set of all representable data of a particular magnitude, and the set of the code words may be the subset of all possible data words generated by a code.

Correctly performed arithmetic operations can receive the code, i.e. with a valid code word as input it is also possible for the output to be a valid code word. An erroneous arithmetic operation or an operation called using unencoded words has a high probability of being able to generate a result which is an invalid code word. In addition, arithmetic codes can also recognize errors which alter data during storage or transport.

On the basis of embodiments, when an application has been encoded using arithmetic codes, it can process only encoded data, i.e. it may be required that all inputs are encoded, and all calculations can use and generate encoded data. Therefore, it may be required that only operations which receive the code in the error-free case are used.

On the basis of embodiments, the encoded version of $x_c$ for a variable x can be received for an AN code by multiplying the original function value $x_f$ of said variable by a constant A. In order to check the code, the remainder of $x_c$ for division by A (which can be called "$x_c$ modulo A") can be calculated, and this remainder may be zero for a valid code word.

An AN code can detect erroneous operations, i.e. incorrectly executed operations, and modified operands, that is to say data, for example, which have been affected by a bit error, for example a bit flip (that is to say an incorrect value in a bit). These errors can be detected because they result in data which have a high probability of not being a multiple of A. The probability of such an error resulting in a valid code may be approximately 1/A. Nevertheless, when a bit flip occurs on the (uncoded) address bus, an incorrect memory word can be accessed which has a high probability of also containing a multiple of A. Therefore, what is known as the "interchanged operand" cannot be detected using an AN code because the error is also a multiple of A. A bit flip in the instruction unit of a CPU can result in the execution of an incorrect operation (what is known as an "interchanged operation"), and this also cannot be recognized by an AN code, because many operators contain the AN code.

ANB codes are also known as such, for example by means of static signatures (what are known as "B"s). The resultant ANB code can additionally detect errors from interchanged operators and interchanged operands. The encoding of a variable x in ANB code is defined as $x_c=A*x_f+B_x$, where $B_x$ can be chosen for any input variable with $0<B_x<A$. For the purpose of checking the code for $x_c$, the remainder of $x_c$ for division by A is calculated. The result must be equal to $B_x$, where $B_x$ is either assigned or calculated in advance at the encoding time.

For the purposes of illustration, the following uncoded C code is considered:

```
// int (abbreviation for integer)
int
f(int x, int y, int z) {
    int u = x + y;
    int v = u + z;
    return v;
}
```

Its ANB-encoded version can use only ANB-encoded data:

```
int_c (abbreviation for int_encoded) f(int_c xc, int_c
yc, int_c zc) {
    int_c uc = xc + yc;     // uc  = A*xf+Bx + A+yf+By
                            //     = A(xf+yf)+Bx+By
    int_c vc = uc + zc;     // vc  = A(xf+yf+zf)+Bx+By+Bz
    return vc;              // expected:vc mod A==Bx+By+Bz
}
```

The pseudo code indicated above is simplified for the sake of clarity and ignores overflow and underfloor problems. The comments indicated in the source code indicate the variable content in the error-free case.

In an embodiment, when the program f is encoded, the input variables x, y and z can be assigned static signatures. If the program is known, the expected signatures $B_v=B_x+B_y+B_z$ for the result can be calculated in advance. When dynamically allocated memory is implemented, dynamic signatures which are known as such can be used. These can be assigned at runtime. If an error interchanges a variable $y_c$ with another encoded variable $u_c=A*u_f+B_u$, the calculated signature $v_c$ mod A for the result would be (Bx+Bu+Bz) instead of the previously calculated, i.e. expected, (Bx+Bu+Bz). If the first addition were to be erroneously replaced by subtraction, the resultant calculated signature would be $(B_x-B_y+B_z)$ instead of (Bx+Bu+Bz)). On the basis of embodiments, an ANB code can recognize interchanged operands and operators in addition to the erroneous operations and modified operands. However, if a bit flip occurs on the address bus when the variable $y_c$ is stored, a lost update for $y_c$ can occur because $y_c$ is stored in an incorrect memory location. When $y_c$ is read the next time, the old version of $y_c$ can be read, which may be correctly ANB-encoded but outdated.

In an embodiment, the use of outdated operands, i.e. lost update, can be determined by using a version D which is known as such and which counts the variable updates. In the resultant ANBD code, the encoded version of x may be as follows: $x_c=A*x_f+B_x+D$. The code checker must know the expected D in order to check the validity of code words. In an embodiment, an ANBD code implementation can be used which applies versions only to the memory which is accessed during load and store instructions but not to registers. This code can therefore be called ANBDmem code.

Encoding of an application or a program, i.e. which allows said application or program to process encoded data, can be effected during different periods of the life of the application or program: prior to the compilation through encoding of the source code, during the compilation through encoding of an intermediate representation of the program, or at runtime through encoding of the binary program during the execution. On the basis of vital coded processors (VCP) which are known as such, an application can perform ANBD encoding at source code level. VCP requires knowledge about the complete data and control flow of the encoded program in order to calculate in advance the signatures of all output variables for a code check. This can prevent the use of dynamically allocated memory and function pointers. In addition, encoded loops and interleaved control flow structures at source code level involve a great deal of effort.

On the basis of software encoded processing (SEP) which is known as such, ANBD encoding can be implemented at assembler level at runtime. An interpreter for a program provided as a binary program can be provided, which is itself encoded using the principles of VCP. It is thus possible to encode any programs using any control flow. Dynamically allocated memory can be encoded using dynamic signatures which are determined at runtime. Error injection methods can show that SEP successfully prevents erroneous output. However, the deceleration observed makes SEP difficult to use in practice.

In an embodiment, compiler based encoding (CBE) is provided. CBE can encode programs at the intermediate code level, for example by using LLVM (Low Level Virtual Machine) code, Java Bytecode, .Net Bytecode, GIMPLE and/or assembler. In an embodiment, the addition of the encoding to the intermediate code level at the compilation time and new concepts for encoding the control flow are provided. In an embodiment, the encoding of control flow can be simplified in comparison with VCP, because no interleaved control structures have to be explicitly handled. In contrast to VCP, CBE can, in an embodiment, provide support for programs with arbitrarily interleaved control structures and dynamically allocated memory. In addition, on the basis of embodiments, all programming languages for which an intermediate code compiler exists, for example C, can be supported. Embodiments are not limited to these programming languages, however.

In contrast to SEP, CBE can provide more complete protection, because it is also able to provide bit-by-bit encoding of logic operators and floating point operations, which are not covered by SEP, and it is also possible to protect against errors (bugs) at the synthesis level of the compiler (compiler back end), which generates code for a specific machine. At the same time, CBE can introduce much less overhead than SEP, because expensive interpretation is not needed. In addition, CBE can restrict the use of expensive memory signatures for dynamically allocated memory. CBE can use static signatures (i.e. signatures calculated by compilation time) for the entire statically allocated memory. In contrast, each data item from the data in SEP may have a dynamic signature, because all signatures are allocated at runtime on account of the interpreter-based implementation.

In order to encode a program using an AN, ANB, ANBD, ANBDmem, residue or Berger code, it may be desirable for each instruction and each variable to be replaced by its suitably encoded version. In an embodiment, the following may be provided, as is described in more detail further below:

1. encoded versions of all instructions, for example all instructions supported by the intermediate code,
2. encoding of all constants and initialization values,
3. processing of calls to external libraries, and
4. encoding of control and data flow, for example by checking that instructions are executed in the correct order using the correct operands and that all jump conditions are executed correctly.

(1) Encoded instructions: fundamental arithmetic and Boolean operations may be encoded, as is known as such. More complex operations, such as bit-by-bit logic operations, type conversion, shift operations or floating point operations, may likewise be encoded, as is known as such. In an embodiment, encoding of the control and of data is provided.

(2) Encoding of constants and initializers: in an embodiment, A and the static signatures are selected at the encoding time, that is to say at the compilation time, and the uncoded constants and initializers can be replaced by their encoded versions at the compilation time.

(3) External calls: in contrast to SEP, the static instrumentation of CBE cannot allow the protection of external libraries for which the source code is not available at the compilation time. In an embodiment, interfaces (wrappers) may be provided for the call to these libraries, said interfaces decoding parameters (and also checking the code, for example) and, following execution of the uncoded original, encoding the results obtained. On the basis of embodiments, these wrappers can be implemented by resorting to the specifications of the external functions.

(4) Data and control flow (CF): while AN code can detect only execution and modified-operand errors, in an embodiment, it is possible to use ANB codes such that it also ensures the detection of interchanged operands and operators and any combinations of these errors. The ANBDmem code can also, on the basis of embodiments, detect whether updates to the memory have been lost.

VCP requires statically predictable control flow and allows an output only at a specific point in the program execution. Only at this point are execution errors detectable, because only there is the code of the output checked. By contrast, on the basis of embodiments for CBE, it is possible to provide continuous checking of the program execution, because CBE allows outputs at any points and it is not necessary for the control flow to be statically known and CBE provides fast error recognition (fail-fast behavior), i.e. provides errors as fast as possible, for example, and thereby allows an earlier reaction to them.

In an embodiment, an encoded application (in other words: the encoded program) may continuously generate checking values which it sends to a checking circuit (watchdog). In an embodiment, the encoding means that if an execution error occurs, the encoded application cannot send the expected checking value to the checking circuit. The expected checking values can be determined statically and transferred to the checking circuit, for example as an orderly list s, which is indexed by means of a counter i. i can count the checking messages received. The encoded application may also have a counter i for checking messages that are sent. This can allow the application to provide the expected checking value in an error-free pass. The application may have a list delta, which may be of the same magnitude as the list of the checking circuit. However, the list delta may have the differences from successive elements, for example defined by delta[i]=s[i+1]−s[i]. The first value on the list delta may be the first value on the list s.

In an embodiment, all input variables (parameters, memory access operations and return values from external functions) can be allocated signatures at the encoding time. These signatures can be used, for example also at the encoding time, to calculate for each basic block a block signature (BBx), which may be the sum of the signatures of all results generated in this block.

In addition, in an embodiment, an accumulator acc can be added to the application. acc can be initialized for each basic block x, with the result that it contains the next s[i] minus the basic block signature BBx. While the basic block is executed, the signatures of all results generated can be added to acc. At the end of the block, acc should be equal to s[i] and may be sent to the checking circuit (watchdog) (for example by means of the command to send). In an embodiment, acc has a particular probability of not being able to contain the expected value if some error has changed the data flow, calculations or data. When the acc has been sent, it can be adjusted for the next basic block. In an embodiment, this allows control flow checking to be provided. In an embodiment, control flow checking can be provided which goes beyond interbasic block checking. In an embodiment, it is possible to check that each instruction has been executed in the correct order, using the correct operations, and that its execution was itself free of error.

In an embodiment, in order to prevent a jump from somewhere before the sending of acc to some other send, each basic block may be assigned an identifier (ID) BBx_id. In an embodiment, the ID BBx_id may be subtracted from the acc before a block is executed, and also sent to the checking circuit. The checking circuit can check whether acc+BBx_id==s[i], that is to say whether acc+BBx_id is equal to s[i]. If not, the checking circuit can determine that an error has occurred, and may shut down or terminate the application, for example.

Interbasic block CF and unconditional jumps: the following LLVM byte code is considered below:

```
1 bb1:
2      x = a+b
3      y = x-d
4      br bb2
```

On the basis of embodiments, an ANB/ANBDmem encoding compiler can transform this example into:

```
1 bb1:        ;acc=s[i]-BB1-BB1_id          BB1=Bx+By=(Ba+Bb)+(Ba+Bb-Bd)
2      xc = add_c(ac, Ba, bc, Bb)           ;Bx=Ba+Bb
3      acc += xc mod A                      ;acc=s[i]-BB1-BB1_id+Ba+Bb
4      yc = sub_c(xc, Bx, dc, Bd)           ;By=Bx-Bd=Ba+Bb-Bd
5      acc += yc mod A       ;acc=s[i]-BB1-BB1_id+2*Ba+2*Bd-Bd
6                            ; =s[i]-BB1-BB1_id+BB1=s[i]-BB1_id
7      send(acc, BB1_id)
8      acc += delta(i)                      ;acc=s[i+1]-BB1_id
9      i++                                  ;acc=s[i]-BB1_id
10     acc += BB1_id-BB2-BB2_id             ;acc=s[i]-BB2-BB2_id
11     br bb2
```

The comments (indicated by ';') show the expected value of the accumulator. It should be noted that xc means the encoded version of x, where x is either a variable or a function/instruction.

Line 1 shows the value which acc has at the start of the block bb1. This is ensured by the previously executed block. Lines 2 and 4 contain the encoded versions of the original instructions, the signatures of which are added to acc directly after execution of the instructions. In line 5, acc has the value s[i]-BB1_id. In the next line, acc and the constant BB1_id are sent to the checking circuit (watchdog), which checks whether the sum of the two values is equal to the expected value s[i]. The subsequent lines adjust acc for the next basic block. Line 8 ensures that acc contains the next checking value s[i+1], and line 10 adds BB1_id-BB2-BB2_id. It should be noted that this value is calculated at the compilation time and is therefore constant at runtime. The addition thereof removes the ID BB1_id of the block and instead introduces the ID BB2_id and signature BB2 of the next block.

Conditional jumps: on the basis of embodiments, a check to ensure that the jump destination reached corresponds to the current branch condition is provided for conditional jumps. The following example, in which cond is the branch condition, is considered below:

```
1 bb1:
2      cond = ...
3      br cond bb_true, bb_false
```

The encoded version is:

```
1 bb1:    ;acc=s[i]-BB1-BB1_id BB1=Bcond
2    condc = ...           ;condc=A*0+Bcond if cond is false
3                          or A*1+Bcond if cond is true
4    acc += condc mod A    ;acc=s[i]-BB1-BB1_id+Bcond
5    send(acc, BB1_id)     ;acc=s[i]-BB1_id
6    acc += delta(i)       ;acc=s[i+1]-BB1_id
7    i++                   ;acc=s[i]-BB1_id
8    acc += BB1_id-BBtrue-BBtrue_id-(A*1+Bcond)
9                          ;acc=s[i]-BBtrue-BBtrue_id-
                            (A*1+Bcond)
10   cond = condc / A      ;get function value of condc
11   acc += cond;acc=s[i]-BBtrue-BBtrue_id-(A*1+Bcond)+condc
12   br cond bb_true, bb_false correction
13
14 bb_true:   ;condc = A*1+Bcond => acc=s[i]-BBtrue-BBtrue_id
15 ...
16
17 bb_false_correction:   ;condc=A*0+Bcond=Bcond
18    ; => acc=s[i]-BBtrue-BBtrue_id-A*1
19    acc += A+BBtrue+BBtrue_id-BBfalse-BBfalse_id
20    ; => acc=s[i]-BBfalse-BBfalse_id
21    br bb_False
22
```

-continued

```
23 bb_false:    ;acc=s[i]-BBfalse-BBfalse_id
24 ...
```

In line 4, acc is used in order to check the calculation of the condition condc using the approach already presented. When acc has been sent, line 8 involves acc being adjusted for the basic block bb_true and in order to check whether the executed branch corresponds to condc. For the latter, A*1+Bcond is subtracted as the value that condc has if cond is true. The value added in line 8 is a constant which is known at the encoding time. In line 11, condc is added. If the condition is true, acc now contains the correct block signature and ID at the beginning of bb_true. If it is false, additional corrections are made, which are executed in the basic block bb_false_correction before a jump to the actual destination bb_false. These corrections ensure that if bb_false is entered, acc contains the signature and ID of bb_false. If the branch in line 12 does not correspond to condc, acc will not contain the expected block signature and ID, and a false checking value is sent to the checking circuit. As a result, it is required that BBfalse+BBfalse_id≠BBtrue+BBtrue_id, in other words that the sum of signature and ID is different for the blocks bb_true and bb_false.

Function call: in an embodiment, it is possible to validate that the correct function is called for a function call and that said function is called using the correct, unaltered parameters, and that the function is executed correctly.

In order to ensure that the correct function is called, each function may, in an embodiment, be assigned a function signature by means of which acc is intended to be modified. Before the function returns (that is to say before it is terminated), it adjusts acc for the remaining part of the calling basic block minus this function signature. For non-void functions (that is to say functions with a return value), the return value can be allocated an additional signature. This may ensure a predictable signature for the return value.

In order to ensure that the function is called with the correct unmodified parameters, it is possible, in an embodiment, for the expected signatures of the parameters, which may be known and therefore constant at the encoding time, for example, to be added to acc before the function is called. In the function, the signatures of the parameters actually used (which are calculated at runtime, for example) can be deducted. If they do not match, acc will become invalid. The signatures of the parameters can then be corrected to function-specific signatures, which are independent of the call point. This allows the use of statically calculated correction values which are dependent on the call point and may thus be provided as constant function parameters.

In order to ensure that the function is executed correctly, acc can, in an embodiment, be adjusted before the start of the execution of the function. The remaining signature and ID of the basic block which contains the call point can be removed, and the signature and ID of the first basic block of the function can be added. The correction value used can be determined at the encoding time and can be provided as a constant function parameter. It is then possible for the execution to be continued as described above and for the basic blocks of the called function to be executed and checked.

In an embodiment, a checking circuit (watchdog) can be used in order to check the correct execution of the encoded program during the runtime thereof. It may be arranged outside the encoded program, that is to say may not be part of the encoded program, for example. In an embodiment, the checking circuit may be reliably executed outside the encoded program.

In order to check the execution, it is possible, in an embodiment, for the checking circuit to check whether the sum of the received values acc and basic block ID is equal to s[i]. If the checking circuit determines an unexpected s[i] or the application stops sending values (this being able to be determined by means of a time limit (timeout)), the checking circuit can terminate the application. When the end of s has been reached, both the application and the checking circuit can begin at the start of s again by setting i to the value 0. In an embodiment, the checking circuit can iterate over s, perform periodic comparisons with the received checking values and test whether the application is still alive (that is to say still running, for example). In an embodiment, the simple implementation can support the application of different mechanisms in order to make the execution thereof safe, for example redundant execution on various hardware, such as onboard FPGAs (onboard Field Programmable Gate Arrays) or graphics units, or manual encoding on the basis of VCP. In addition, it is possible, in an embodiment, to provide a plurality of checking circuits in parallel in order to further reduce the risk of an erroneous checking circuit.

In an embodiment, values which are stored in registers and for which static signatures, which are known at the encoding time, can be provided. In an embodiment, dynamic memory access patterns cannot be predicted at the encoding time, and dynamic signatures which are calculated at runtime can be used for values stored in the memory. When a value is stored, its static signature can be converted into a dynamic signature, which may be dependent on the address at which the value is stored. When the value is loaded from the memory, the dynamic signature can be converted back into a static signature which is dependent on the load instruction. These changes can also be encoded.

In an embodiment, the dynamic signature used for memories with versions may additionally be dependent on the number of stores executed previously by the application (for example in the form of a version counter version). The version counter used may be encoded, for example by virtue of its being able to change acc. For loading, the expected dynamic signature and version can be removed and can be replaced by the static signature of the destination register. These changes and the signature management can be encoded. The instruction list below shows an ANBDmem-encoded load operation. The ANB-encoded version may have a similar appearance, but cannot contain the version removal in line 5. The getVersion function can return the expected version for a given address. It may also be encoded. The encoded version management can be implemented on the basis of a method which is known as such. Version management with snapshots can be used and can provide good results for applications with high and low levels of data locality.

```
1 uint64_5 loadc(ptrc, Bptr, corr) { // corr=A*Br+Bptr
2   ptr = ptrc / A;        // decode address
3   vc = load(ptr);        // load value => vc+A*r+ptr+version
4   t =(ptrc-corr)/A;     //t=(A*ptr+Bptr)-(A*Br+Bptr))/A=ptr-Br
5   rc = (vc-t-getVersion(ptr); //rc=vc-(ptr-Br)-version
6   rc+=(ptrc-corr)%A;//additional check that (ptr-corr)%A==0
7   return rc;             //=A*r+Br
8 }
```

As shown in the above code, loading may have an encoded pointer $ptr_c$, the expected signature $B_{ptr}$ of $ptr_c$ and a correction value corr as input. During encoding, the value $B_r$<A can be chosen for the signature of the result. Since $B_{ptr}$ and A can also be chosen at the encoding time, corr=$A*B_r+B_{ptr}$ for each call to load is also constant at runtime. If a false or outdated address is read, the return value in line 7 will not have the expected signature $B_r$. In an embodiment, a memory can be implemented in similar fashion.

Figure 8:
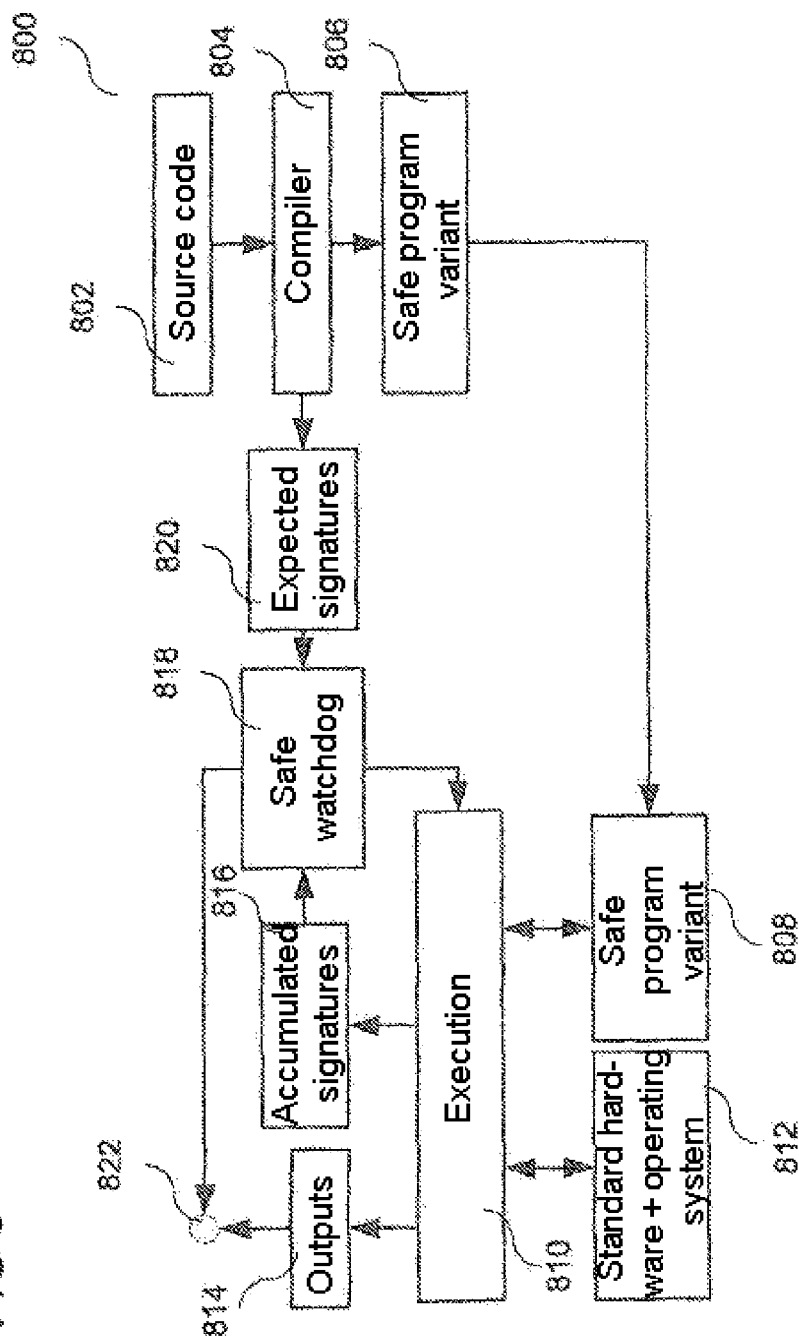
FIG. 8 shows a data processing arrangement based on an exemplary embodiment of the invention.

FIG. 8 shows a data processing arrangement 800 based on an exemplary embodiment of the invention. Source code 802 can be supplied to a compiler 804 (for example software encoding compiler). The compiler 804 can then generate a safe program variant 806 and expected signatures 820. Translation, for example including linking, converts the safe program variant 806 into an executable encoded program 808 which, by way of example, can be executed on standard hardware and a standard operating system 812. Encoded execution 810 of the executable encoded program 808 can take place. Output values 814 from the executable encoded program 808 can be verified by a safe watchdog (in other words a safe checking circuit 818), represented by arrow and circle 822. The verification can be executed by virtue of the encoded execution 810 sending accumulated signatures 816 to the safe checking circuit (watchdog) 818, and the latter comparing the accumulated signatures 816 with the expected signatures 820.

If the accumulated signatures do not match the expected signatures, the checking circuit (watchdog) can terminate the execution of the protected program.

Outputs can also pass directly through the checking circuit (watchdog). To this end, the encoded outputs need to be sent to the checking circuit with the current accumulator value. The checking circuit then checks the accumulator value against the reference numbers and the encoded outputs. If these values have passed the test, the checking circuit decodes the outputs and outputs these decoded outputs.

The text below describes evaluations of methods and data processing arrangements based on embodiments using the following applications: md5 calculates the md5 hash of a character string, tcas is an implementation of the public source code (open source) for the traffic warning and collision avoidance system which is prescribed for aircraft, pid is a proportional integral differential controller, abs implements an antilock braking system, and primes implements the sieve of Eratosthenes.

Figure 9:
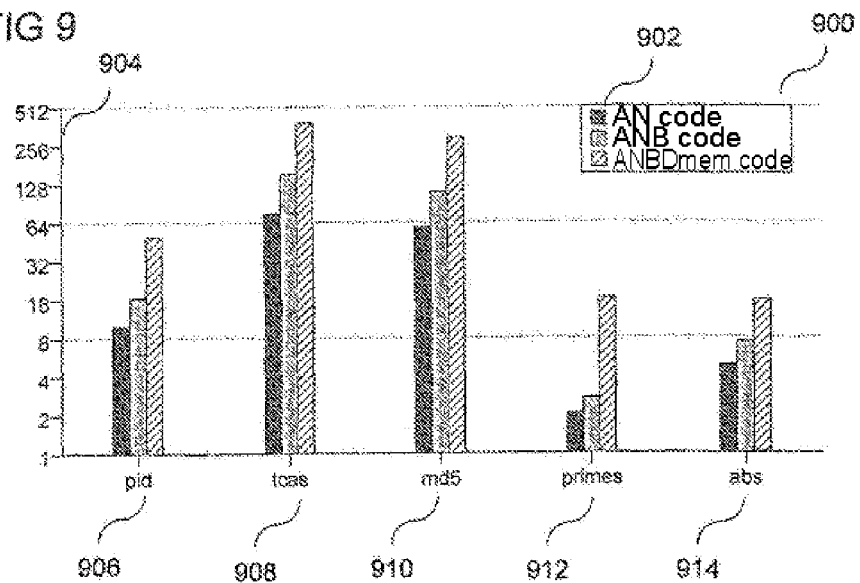
FIG. 9 shows a graph for computation time comparison for methods based on an exemplary embodiment of the invention.

FIG. 9 shows a graph 900 for computation time comparison for methods based on an exemplary embodiment of the invention. The vertical axis 904 is used to provide the values for deceleration of the encoded applications via a native (in other words: unencoded), unprotected application. As the legend 902 shows, values are indicated for AN, ANB and ANBDmem codes. In order to generate the graph, the time for the entire application, including input/output operations, has been measured. 906 shows the results for pid. 908 shows the results for tcas. 910 shows the results for md5. 912 shows the results for primes. 914 shows the results for abs.

For AN code, the decelerations are situated in the range from factor 2 (primes) to 75 (tcas), in other words the execution using AN code takes approximately twice as long in the case of primes, for example, as for the native code, and in the case of tcas approximately 75 times as long. Applications which use relatively expensively encoded operations such as multiplications or floating point operations exhibit greater decelerations. This can result in these greatly varying decelerations. By way of example, md5 contains an above average number of bit-by-bit logic operations which, in their encoded version, make extensive use of expensively encoded multiplications. The encoded version of tcas may be much slower owing to the extensive use of floating point operations.

ANB code may be on average 1.9 times slower than AN code, because it provides encoded control and data flow and the encoded operations used likewise need to take account of the signatures.

The deceleration of ANBDmem code in comparison with ANB code may be 2.6 on average. The main reason may be the additionally required overhead for safely storing and receiving version information for dynamic memory. This overhead may be dependent on the degree of locality of the executed memory access operations.

Figure 10:
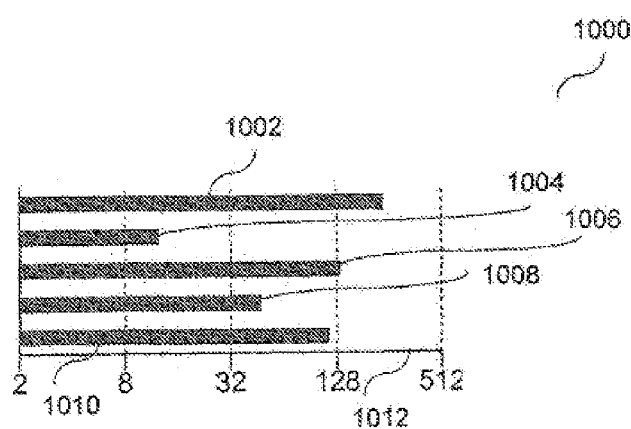
FIG. 10 shows a graph for computation time comparison for methods based on an exemplary embodiment of the invention.

FIG. 10 shows a graph 1000 for computation time comparison for methods based on an exemplary embodiment of the invention. This shows the speed increase (as a factor) on a logarithmic axis 1012 for CBE based on embodiments in comparison with SEP. 1002 shows the results for primes. 1004 shows the results for md5. 1006 shows the results for pid. 1008 shows the results for bubblesort. 1010 shows the results for quicksort. For these applications, graph 1000 compares the speed increase of the most expensive CBE variant (ANBDmem) based on embodiments with SEP. tcas and abs are not supported by SEP on account of the absence of system calls. CBE always clearly exceeds the performance of SEP. It can be observed that the speed increases obtained are dependent on the executed program. By way of example, md5 has relatively small speed increases. md5 contains an above average number of bit-by-bit logic operations. However, SEP is incomplete, for example it does not support an encoded version of bit-by-bit logic operations, shift operations and type conversions. These operations are executed in unencoded form in SEP, whereas they are encoded in CBE based on embodiments.

To evaluate the error recognition capabilities of encoded programs based on embodiments, an error injector EIS which is known as such was used. This injects the software level symptoms of possible hardware errors. The following symptoms were injected: interchanged operands, interchanged operators, erroneous operations, modified operands and lost stores. Further errors can be represented by combinations of these symptoms.

These errors were applied in three different modes:

In deterministic mode (Det), exactly one error per pass was injected. Approximately 50 000 passes were carried out for each example application (benchmark) and protection mechanism (10 000 for each symptom). In each pass, a different error was triggered. This tests the capability of a detection mechanism to handle rarely occurring errors.

In probabilistic mode (Prob), an error having a prescribed probability was injected. The same probability of error was used for all evaluated detection mechanisms. At every possible point at which an error was able to be triggered (when one of the symptoms was present), an error having the given probability is injected. It was thus possible to execute several different errors. This mode was used to carry out 6000 passes for each example application and per detection mechanism.

In permanent error mode (Per), permanently erroneous operation errors, which simulate permanent logic errors in the processor, are injected. Permanent errors were applied only to arithmetic integer operations and to loading and storage of integer values. Approximately 1700 permanent errors per example application per detection mechanism were injected, with in each case just one error per pass.

All the example applications are of similar magnitude, and the injections were distributed evenly over the program execution. As a result, it is possible to achieve similar coverages for all applications with a fixed number of error injection passes. The number of error injection passes was chosen such that the experiments were able to be completed in a feasible time.

The results of the injection passes were compared with the results of an error-free pass in order to determine whether the injected error resulted in an SDC, i.e. in failure of the error recognition, in termination or in a correct output, i.e. whether the error was masked.

Figure 11:
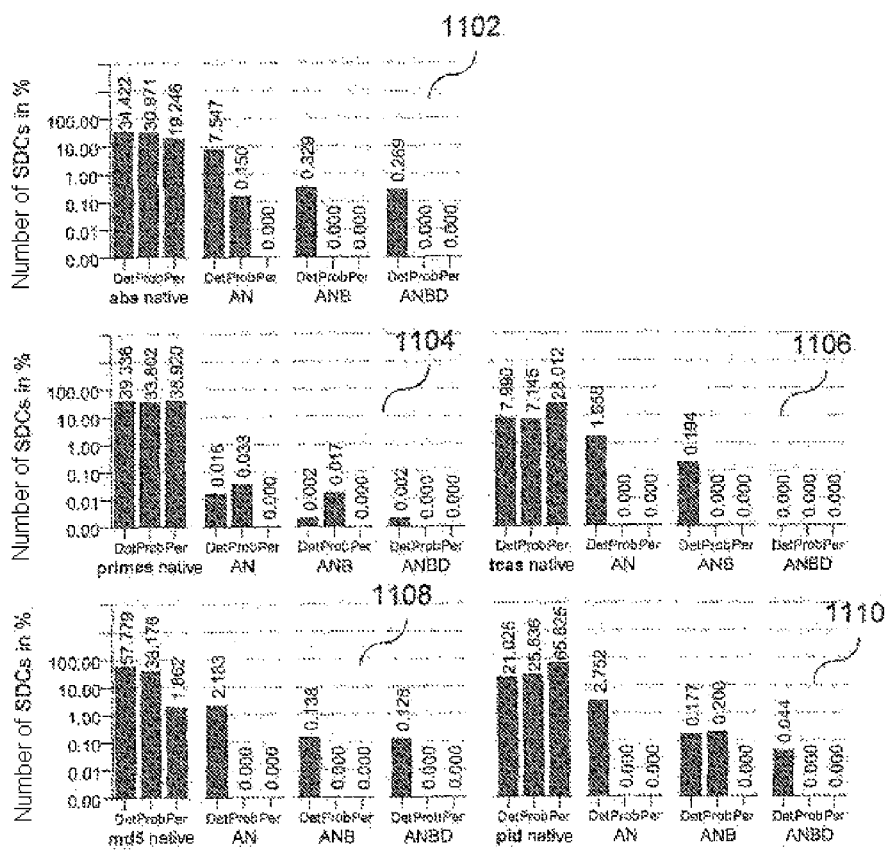
FIG. 11 shows graphs for computation time comparison for methods based on an exemplary embodiment of the invention.

FIG. 11 shows a plurality 1100 of graphs for the computation time comparison of methods based on an exemplary embodiment of the invention. The number of SDCs is shown as results for the experiment involving all the error injection passes described above. 1102 shows the results for abs. 1104 shows the results for primes. 1106 shows the results for tcas. 1108 shows the results for md5. 1110 shows the results for pid. The number of SDCs is so relevant to the evaluation because they identify failure of the error recognition. It should be noted that the graphs 1100 are shown on a logarithmic scale.

From the graphs 1100, it is possible to make the following observations: in contrast to native, i.e. unprotected, programs, the AN-encoded versions dramatically reduce the number of SDCs, i.e. undetected errors. However, the AN-encoded versions still have a considerable number of SDCs: on average 0.96%. The highest rate of undetected errors is 7.6% for abs and det. ANB encoding can lower the number of undetected errors to 0.07% on average. ANBDmem encoding in turn can half the rate to approximately 0.03% SDCs.

In contrast to unprotected applications, none of the encoded versions—regardless of the code used—is vulnerable to permanent errors. Probabilistically (Prob) injected errors are likewise detected more often. The reason is that programs in both injection modes are affected by multiple errors more often. This can increase the probability of detection.

In order to show the effect of ANB and ANBDmem code over AN code, the overhead can be compared with the recognition rate. On average, ANB code has an approximately 14 times higher error recognition rate than AN code, while the deceleration increases only by 1.9 times. ANBDmem code has an approximately 32 times higher recognition rate than AN code, at the cost of approximately 5 times greater deceleration. Both ANB code and ANBDmem code are able to compensate for the respectively longer computation time with a disproportionately higher recognition rate.

Control flow checking, which can be implemented in hardware or software, provides means for recognizing invalid control flow for the executed program, i.e. execution of sequences of instructions which are illegal for the executed binary program. In contrast to encoding, control flow checking does not recognize errors which influence only the processed data. Control flow checking can be performed only for interbasic block control flow. On the basis of embodiments, ANB-encoded and ANBDmem-encoded programs can be checked at the instruction level.

Algorithm-based error tolerance and self-checking software uses invariants for checking the validity of the results generated. There are often no suitable invariants which provide a good error recognition capability.

Other software approaches use replicated execution and comparison (and tuning) over the results obtained. The protected software is changed during or before compilation. Dynamic binary instrumentation is used. Replication is applied to different levels of the abstraction. Some approaches duplicate single instructions within an execution thread. Others use duplicates of the entire program by using multiple execution threads.

Instead of or in addition to duplication, arithmetic codes are used in order to recognize errors. The program and the processed data are altered.

VCP and SEP both use ANBD code.

In an embodiment, compiler-based encoding (CBE) can be provided. It is possible to provide control flow encoding by using arithmetic codes having signatures, for example ANB codes, ANBD codes, ANBDmem codes, residue codes and/or Berger codes.

Experiments have shown that these two codings can reduce the number of undetected execution errors further than AN encoding. The reduction of SDCs (undetected errors) is greater than the increase in the runtime which may be accepted for the advanced protection of ANBD and ANBDmem encoding. Thus, safety engineers can weigh up the error recognition coverage and the performance overhead against one another by selecting suitable arithmetic encoding.

On average, ANBDmem-encoded applications can be 108 times faster than their SEP version. In addition, CBE may be more complete than SEP. In contrast to CBE, SEP cannot support the encoding of bit-by-bit logic operations, type conversion, shift operations and floating point operations.

The invention claimed is:

1. A method for data processing for providing a value for determining whether an error has occurred during execution of a program, the method comprising:
   determining a numerical value on the basis of a plurality of reference numbers that is determined by a checking circuit outside the program, wherein the plurality of reference numbers is a plurality of prescribed random numbers;
   determining a signature for at least one instruction in the program using an arithmetic code;
   updating an accumulator value on the basis of the numerical value and the signature; and
   transmitting the updated accumulator value to the checking circuit in order to determine whether an error has occurred during the execution of the program on the basis of the plurality of reference numbers and the accumulator value.

2. The method as claimed in claim 1, wherein the arithmetic code is an arithmetic code having signatures.

3. The method as claimed in claim 1, wherein the arithmetic code has at least one code from a group of codes consisting of:
   an AN code;
   an ANB code;
   an ANBD code;
   an ANBDmem code;
   a residue code; and
   a Berger code.

4. The method as claimed in claim 1, wherein the checking circuit is implemented using safe hardware.

5. A method for data processing for providing a value for determining whether an error has occurred during execution of a program, the method comprising:
   determining a numerical value on the basis of a plurality of reference numbers that is determined by a checking circuit outside the program, wherein the numerical value is a difference between two reference numbers;
   determining a signature for at least one instruction in the program using an arithmetic code;
   updating an accumulator value on the basis of the numerical value and the signature; and
   transmitting the updated accumulator value to the checking circuit in order to determine whether an error has occurred during the execution of the program on the basis of the plurality of reference numbers and the accumulator value.

6. A method for data processing for providing a value for determining whether an error has occurred during execution of a program, the method comprising:
   determining a numerical value on the basis of a plurality of reference numbers that is determined by a checking circuit outside the program;
   determining a signature for at least one instruction in the program using an arithmetic code;
   updating an accumulator value on the basis of the numerical value and the signature, wherein the accumulator value is updated on the basis of subtraction of a signature for a basic block of the program, and respective addition of the signature of the succeeding basic block; and
   transmitting the updated accumulator value to the checking circuit in order to determine whether an error has occurred during the execution of the program on the basis of the plurality of reference numbers and the accumulator value.

7. A method for data processing for providing a value for determining whether an error has occurred during execution of a program, the method comprising:
   determining a numerical value on the basis of a plurality of reference numbers that is determined by a checking circuit outside the program;
   determining a signature for at least one instruction in the program using an arithmetic code;

updating an accumulator value on the basis of the numerical value and the signature, wherein the accumulator value is updated on the basis of addition of the numerical value; and transmitting the updated accumulator value to the checking circuit in order to determine whether an error has occurred during the execution of the program on the basis of the plurality of reference numbers and the accumulator value.

8. A method for data processing for providing a value for determining whether an error has occurred during execution of a program, the method comprising:
    determining a numerical value on the basis of a plurality of reference numbers that is determined by a checking circuit outside the program;
    determining a signature for at least one instruction in the program using an arithmetic code;
    determining an identifier for a basic block of the program;
    updating an accumulator value on the basis of the numerical value and the signature; and
    transmitting the updated accumulator value to the checking circuit in order to determine whether an error has occurred during the execution of the program on the basis of the plurality of reference numbers and the accumulator value.

9. The method as claimed in claim 8, wherein the accumulator value is updated also on the basis of the identifier of the block.

10. A method for data processing for providing a value for determining whether an error has occurred during execution of a program, the method comprising:
    determining a numerical value on the basis of a plurality of reference numbers that is determined by a checking circuit outside the program;
    determining a signature for at least one instruction in the program using an arithmetic code;
    updating an accumulator value on the basis of the numerical value and the signature; and
    transmitting the updated accumulator value to the checking circuit in order to determine whether an error has occurred during the execution of the program on the basis of the plurality of reference numbers and the accumulator value, wherein it is determined whether an error has occurred on the basis of a check to determine whether the transmitted accumulator value corresponds to the difference between two reference numbers.

11. A method for data processing for determining whether an error has occurred during execution of a program, the method comprising:
    determining a plurality of reference numbers in a checking circuit outside the program, wherein the checking circuit is protected by arithmetic codes;
    receiving an accumulator value, generated in a program on the basis of the plurality of reference numbers and a signature—determined by means of an arithmetic code—for at least one instruction in the program, from a program in the checking circuit; and
    determining, in the checking circuit, whether an error has occurred during the execution of program on the basis of the plurality of reference numbers and the accumulator value.

12. The method as claimed in claim 11, wherein the arithmetic code is an arithmetic code having signatures.

13. The method as claimed in claim 11, wherein the arithmetic code has at least one code from a group of codes consisting of:
    an AN code;
    an ANB code;
    an ANBD code;
    an ANBDmem code;
    a residue code; and
    a Berger code.

14. The method as claimed in claim 11, wherein the checking circuit is implemented using safe hardware.

15. The method as claimed in claim 11, wherein the checking circuit is protected by redundancy.

* * * * *